(12) United States Patent
Sundstrom

(10) Patent No.: US 7,557,425 B2
(45) Date of Patent: Jul. 7, 2009

(54) PACKAGE CAP WITH BYPASS CAPACITANCE

(75) Inventor: Lance L. Sundstrom, Pinellas Park, FL (US)

(73) Assignee: Honeywell International Inc., Morristown, NJ (US)

( * ) Notice: Subject to any disclaimer, the term of this patent is extended or adjusted under 35 U.S.C. 154(b) by 254 days.

(21) Appl. No.: 11/130,744

(22) Filed: May 17, 2005

(65) Prior Publication Data

US 2006/0261466 A1 Nov. 23, 2006

(51) Int. Cl.
*H01L 29/00* (2006.01)
(52) U.S. Cl. ............... 257/532; 257/686; 257/777; 257/E27.25; 257/E27.034; 257/E27.048

(58) Field of Classification Search ............ 257/532, 257/678, 686, 777, 306, E27.25, E27.034, 257/E27.048
See application file for complete search history.

(56) References Cited

U.S. PATENT DOCUMENTS

| | | | | |
|---|---|---|---|---|
| 6,875,921 B1* | 4/2005 | Conn | ............... | 174/534 |
| 7,115,988 B1* | 10/2006 | Hool | ............... | 257/713 |
| 2003/0189246 A1* | 10/2003 | Iwaki et al. | ............... | 257/706 |

* cited by examiner

*Primary Examiner*—Hsien-ming Lee
(74) *Attorney, Agent, or Firm*—McDonnell Boehnen Hulbert & Berghoff LLP

(57) ABSTRACT

An integrated circuit package is provided. The package comprises a lid which is adapted to cover an integrated circuit, the lid is further adapted to provide bypass capacitance to the integrated circuit.

27 Claims, 14 Drawing Sheets

PACKAGE CAP WITH BYPASS CAPACITANCE

TECHNICAL FIELD

The present invention relates generally to integrated circuits (ICs) and in particular to bypass capacitance for ICs.

BACKGROUND

Components and connections within integrated circuits (ICs) often generate electrical noise during use. ICs have to be designed so that the noise generated from a component or connection does not interfere with the performance of other components and connections within the same IC or other ICs in the system. An example of a noise generated by a component and connection is a ripple voltage. A ripple voltage is an alternating current (AC) component that adds to the direct current (DC) component of a voltage. One method of removing or reducing ripple voltage is with the use of bypass capacitors. Bypass capacitors are more effective as the equivalent series inductance (ESL) and equivalent series resistance (ESR) between the IC and its bypass capacitance is minimized.

As IC packages shrink to satisfy the desire for reduced size and weight, conventional chip bypass capacitors used to eliminate or reduce noise have been moved out of and/or off the host packages and onto the host printed wiring board (PWB). This results in longer path lengths between the IC and its bypass capacitance. The parasitic series resistance and inductance of the longer path length increases the ESL and ESR of the IC's bypass capacitance, making it less effective.

For the reasons stated above and for other reasons stated below which will become apparent to those skilled in the art upon reading and understanding the present specification, there is a need in the art for a method of providing effective bypass capacitance to an IC.

SUMMARY

The above-mentioned problems and other problems are resolved by the present invention and will be understood by reading and studying the following specification.

In one embodiment, an integrated circuit package is provided. The package comprises a lid which is adapted to cover an integrated circuit, the lid is further adapted to provide bypass capacitance to the integrated circuit.

In one embodiment, an integrated circuit bypass capacitance system is provided. The system comprises an integrated circuit and a package. The package includes a base. The base comprises a cavity adapted to receive one or more integrated circuits. The package also includes a lid adapted to couple to the base and substantially cover the integrated circuit. The lid is further adapted to provide bypass capacitance to the integrated circuit.

In one embodiment, a method of operating an integrated circuit is provided. The method comprises providing bypass capacitance with one or more capacitors in a lid of an integrated circuit package.

In one embodiment, a method of reducing ESL and ESR while providing bypass capacitance to one or more integrated circuits is provided. The method comprises integrating capacitance layers into a lid of a package and edge terminating the conductor layers of the integral capacitance. The method also comprises vertically connecting the edge terminations of the layers of the capacitors and connecting the vertical connections of the capacitance layers in the lid to additional capacitors attached to the lid and to one or more integrated circuits in the package base.

In one embodiment, a lid adapted to cover an integrated circuit is provided. The lid comprises at least one power terminal adapted to provide an electrical connection to the integrated circuit. The lid also comprises a ground terminal adapted to provide an electrical connection to the integrated circuit and bypass capacitance coupled to the at least one power terminal and ground terminal.

In one embodiment, a base adapted to couple to a bypass capacitance lid is provided. The base comprises a body and protuberances selectively positioned along the body to form a cavity adapted to receive an integrated circuit. The protuberances are further adapted to couple the lid to the body and provide electrical connections to the integrated circuit. The electrical connections provide a circuit connection to the bypass capacitance lid.

BRIEF DESCRIPTION OF THE DRAWINGS

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention comprise bypass capacitors that eliminate or reduce noise generated by components and connections within integrated circuits (ICs). The present invention increases the effectiveness of the bypass capacitors by reducing the equivalent series inductance (ESL) and equivalent series resistance (ESR) between the IC and its bypass capacitance. This is accomplished by reducing the parasitic series inductance and resistance of the paths between the IC and the IC's bypass capacitance. In one embodiment, the bypass capacitance is integrated into the lid of a package surrounding an IC. In another embodiment, the bypass capacitance is mounted to the lid of a package surrounding an IC. In still another embodiment, bypass capacitance in integrated into the lid of a package surrounding the IC and additional bypass capacitance is added in the form of chip capacitors attached to the top of the lid.

Figure 1:
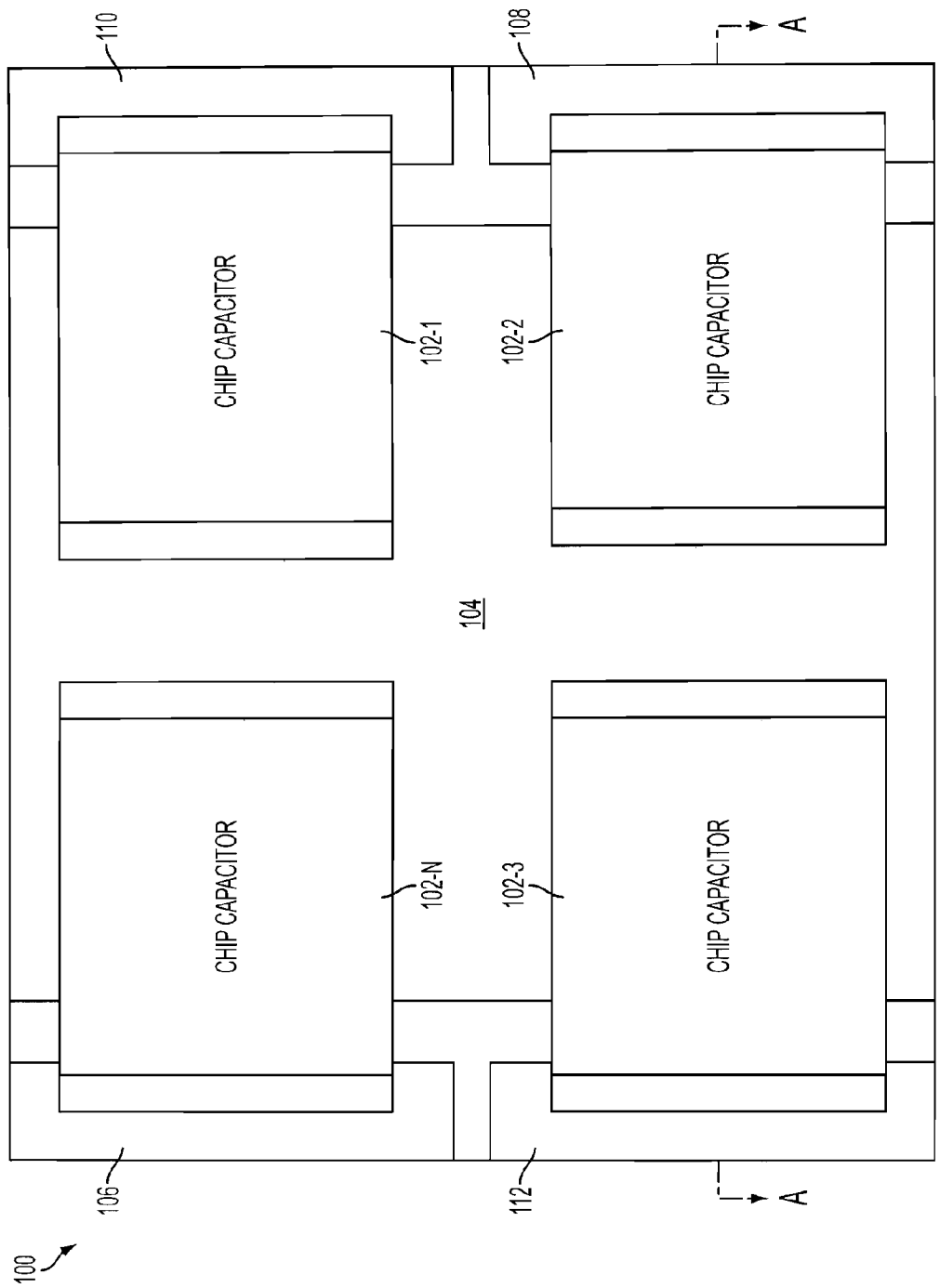
FIG. 1 is a top view of one embodiment of a package cap with attached chip capacitors.

FIG. 1 is a top view of a package cap 100 (or lid 100) of one embodiment of the present invention with chip capacitors 102-1 through 102-N attached. A chip or die is the actual piece of silicon that contains an integrated circuit (IC). The IC must fit within the cavity of a package. The package is a sealed protective container that houses the IC. Packages include a lid (such as lid 100) and a base (such as base 1000 of FIG. 10 and base 1200 of FIG. 12). Packages provide for power, ground and signal distribution, power dissipation, and protection of the circuits. In embodiments of the present invention package cap 100 mates with a base of a package to substantially enclose an IC.

In one embodiment, package cap 100 is an adaptor substrate (with no substantial internal bypass capacitance) that comprises a ground terminal 104. In one embodiment, the ground terminal 104 is adapted to receive a plurality of chip capacitors 102-1 through 102-N and provides a common ground for the chip capacitors 102-1 through 102-N. Chip capacitors 102-1 through 102-N are soldered onto the capacitor attach pad portion of ground terminal 104. The shaded regions of chip capacitors 102-1 through 102-N represent the terminal edges of the chip capacitors 102-1 through 102-N. Ground terminal 104 wraps around the adaptor substrate and provides a low electrical and thermal impedance connection between chip capacitors 102-1 through 102-N and the host package (base) and its internal IC(s).

Package cap 100 also comprises power terminals 106, 108, 110 and 112. Power terminals 106, 108, 110 and 112 wrap around the adaptor substrate and provide a low electrical and thermal impedance connections between chip capacitors 102-1 through 102-N and the host package (base) and its internal IC(s). Chip capacitors 102-1 through 102-N are connected to the capacitor attach pad portion of ground terminal 104 and one of the capacitor attach pad portion of power terminals 106, 108, 110 and 112. The host package (base) and its internal IC(s) are electrically connected to ground terminal 104 and power terminals 106, 108, 110 and 112 and to external power and ground sources through its PWB interface. Examples of PWB interfaces are ball grid arrays, peripheral leads or other interfaces known by those skilled in the art. This causes the chip capacitors 102-1 through 102-N to be connected in parallel with the IC power and ground connections and provides the IC with bypass capacitance. As the need for more bypass capacitance increases, additional and or larger value chip capacitors 102-1 through 102-N are added.

In one embodiment, power terminals 106 and 108 are connected to the same power source and may generally be referred to as "first power terminals 106 and 108." In one embodiment, power terminals 110 and 112 are connected to the same power source and may generally be referred to as "second power terminals 110 and 112." This provides redundant electrical connections to the host package and internal IC(s). This also distributes power connections around the base package and internal IC.

Figure 2:
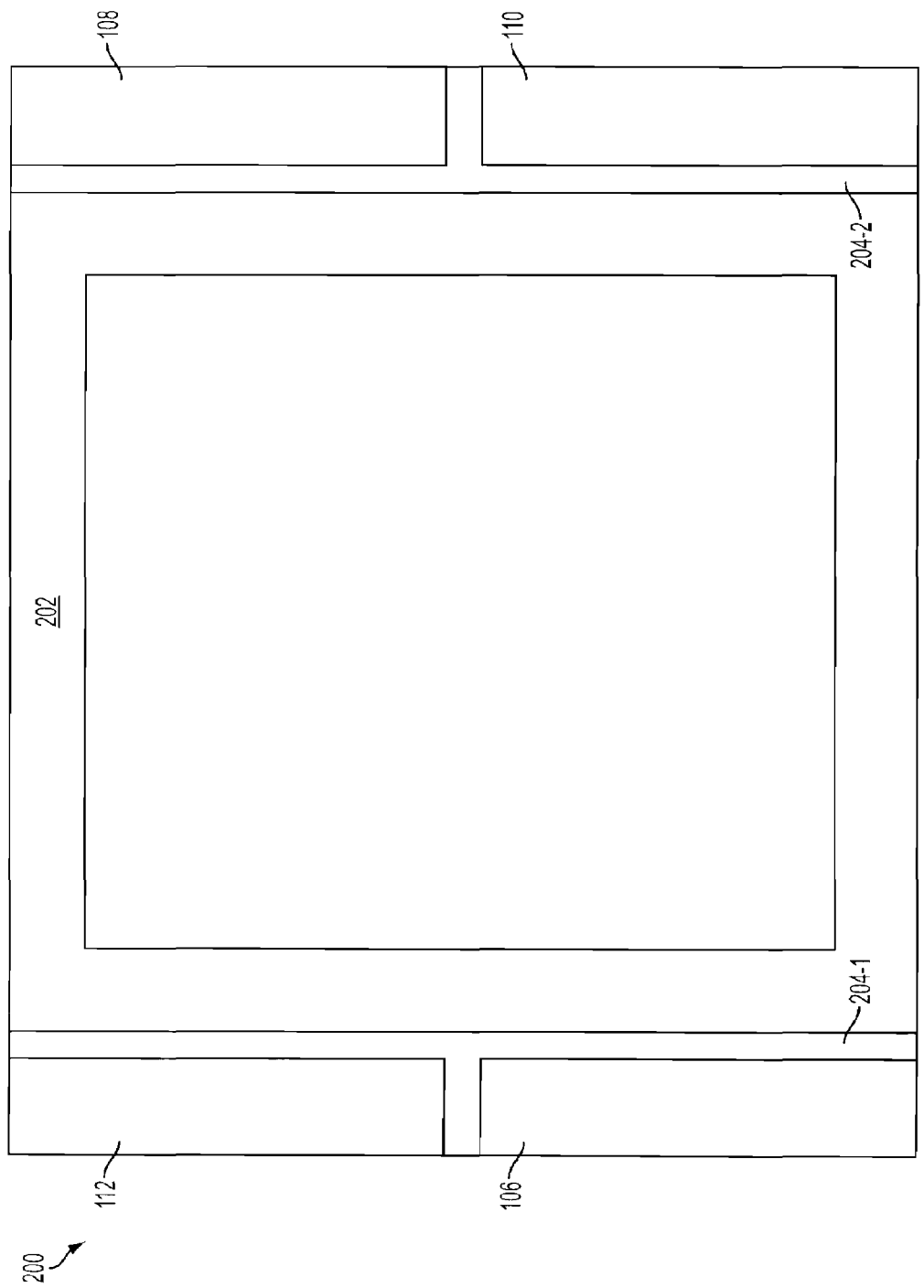
FIG. 2 is a bottom view of one embodiment of the package cap assembly of F*igure* 1.

FIG. 2 is a bottom view of the package cap 100 of FIG. 1 with attached chip capacitors 102-1 through 102-N (not visible) shown generally at assembly 200. Package cap assembly 200 comprises a package ring seal ring attach pad 202 portion of ground terminal 104. The seal ring attach pad 202 mates with a host package (base) (for example base 1000 of FIG. 10 and base 1200 of FIG. 12) to seal the IC die cavity and to provides an electrical connection (e.g. common ground) to the host package and internal IC(s).

Seal ring attach pad 202 is soldered onto the host package and seals the IC die cavity that is formed by the host package. In one embodiment, this seal is hermetic. The package cap assembly 200 also comprises power terminals 106, 108, 110 and 112. The package attach pad portions of power terminals 106, 108, 110 and 112 provide additional electrical connections to the host package and internal IC(s) as described above with respect to first power terminals 106 and 108 and second power terminals 110 and 112 in FIG. 1.

A pair of gaps 204-1 and 204-2 separate the power terminals 106, 108, 110 and 112 from the seal ring attach pad 202 portion of ground terminal 104. During a reflow attach process, the gaps 204-1 and 204-2 vent the solder interfaces and facilitate post assembly cleaning. Venting avoids gas entrapment that could interfere with forming a seal during the solder reflow attach process.

Figure 3:
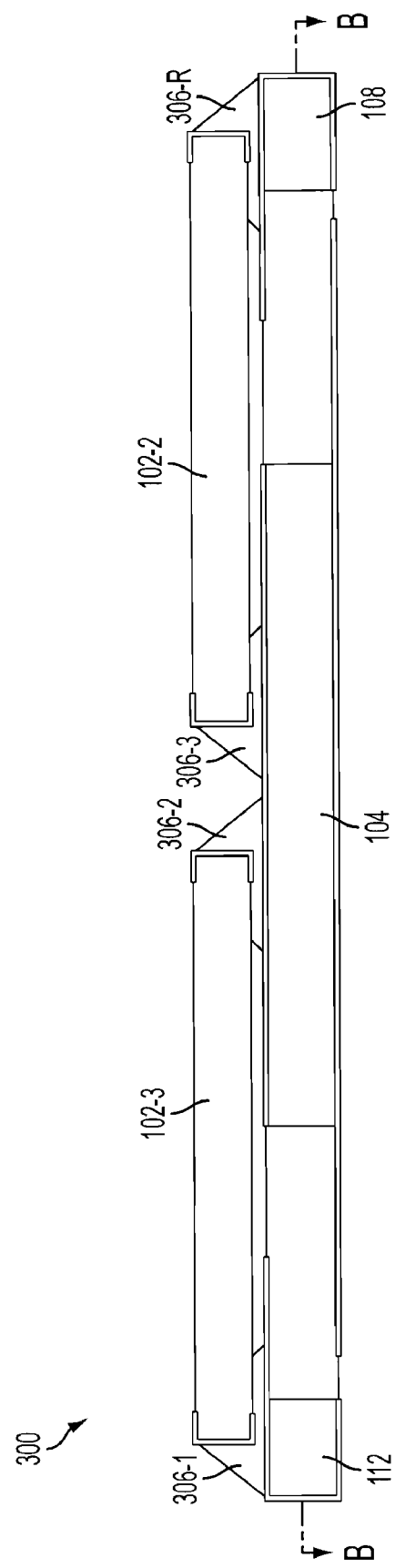
FIG. 3 is a front edge view of one embodiment of the package cap assembly F*igure* 1.

FIG. 3 is a front edge view of the package cap 100 of FIG. 1 with attached chip capacitors shown generally as assembly 300. In this embodiment, package cap assembly 300 is comprised of chip capacitors 102-1 to 102-N with 102-3 and 102-2 visible in this view and attached to package cap 100 as shown. Chip capacitor 102-3 is soldered onto a capacitor attach pad portion of power terminal 112 on one end via solder connection 306-1. On the other end, chip capacitor 102-3 is soldered onto a capacitor attach pad portion of ground terminal 104 via solder connection 306-2. Chip capacitor 102-2 is soldered onto a capacitor attach pad portion of power terminal 108 on one end via solder connection 306-R. On the other end, chip capacitor 102-2 is soldered onto a capacitor attach pad portion of ground terminal 104 via solder connection 306-3. The end terminals of chip capacitors 102-3 and 102-2 are represented by dark thick lines.

Ground terminal 104 wraps around the edge of an adaptor substrate as shown, and provides an electrical connection to a host package (base) and one or more ICs disposed within the host package. The end terminals of ground terminal 104 are represented by dark thin lines. Also, power terminal 108 and power terminal 112 wrap around the edge of an adapter substrate to provide electrical connections to a host package (base) and one or more ICs disposed within the host package. The end terminals of power terminals 108 and 112 are also represented by dark thin lines.

Figure 4:
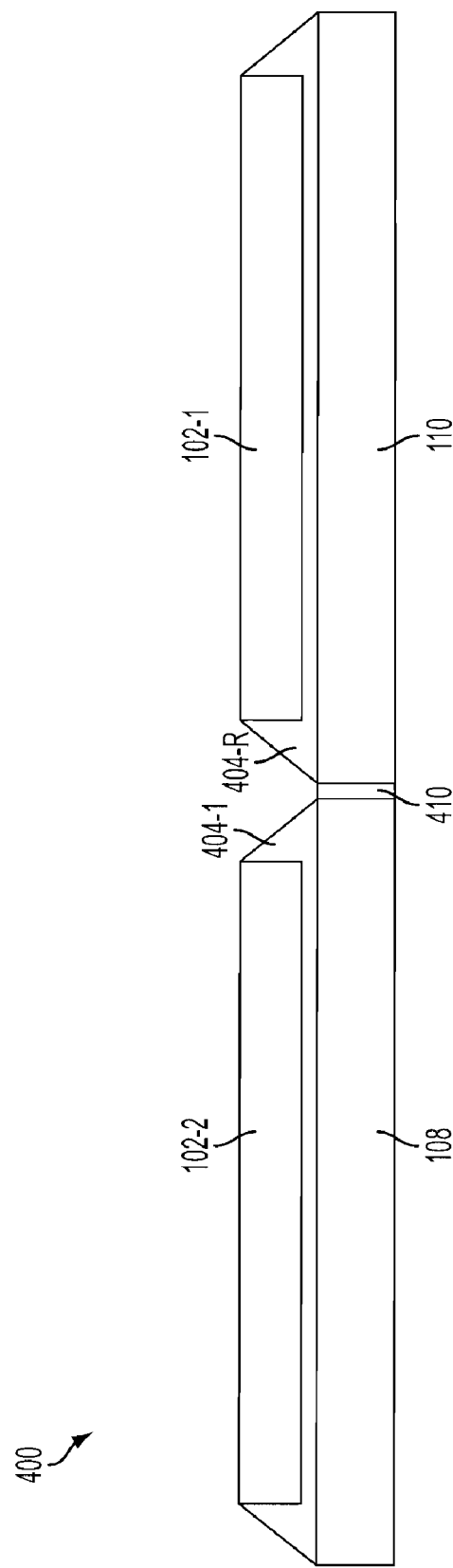
FIG. 4 is a side edge view of one embodiment of the package cap assembly F*igure* 1.

FIG. 4 is a side edge view of the package cap 100 of FIG. 1 with attached chip capacitors 102-1 through 102-N shown generally as assembly 400 with chip capacitors 102-1 and 102-2 visible in this view. In this embodiment, chip capacitor 102-2 is soldered onto a capacitor attach pad portion of power terminal 108 via solder connection 404-1. Chip capacitor 102-1 is soldered onto a capacitor attach pad portion of power terminal 110 via solder connection 404-R. A gap 410 separates power terminal 108 and power terminal 110.

Figure 5:
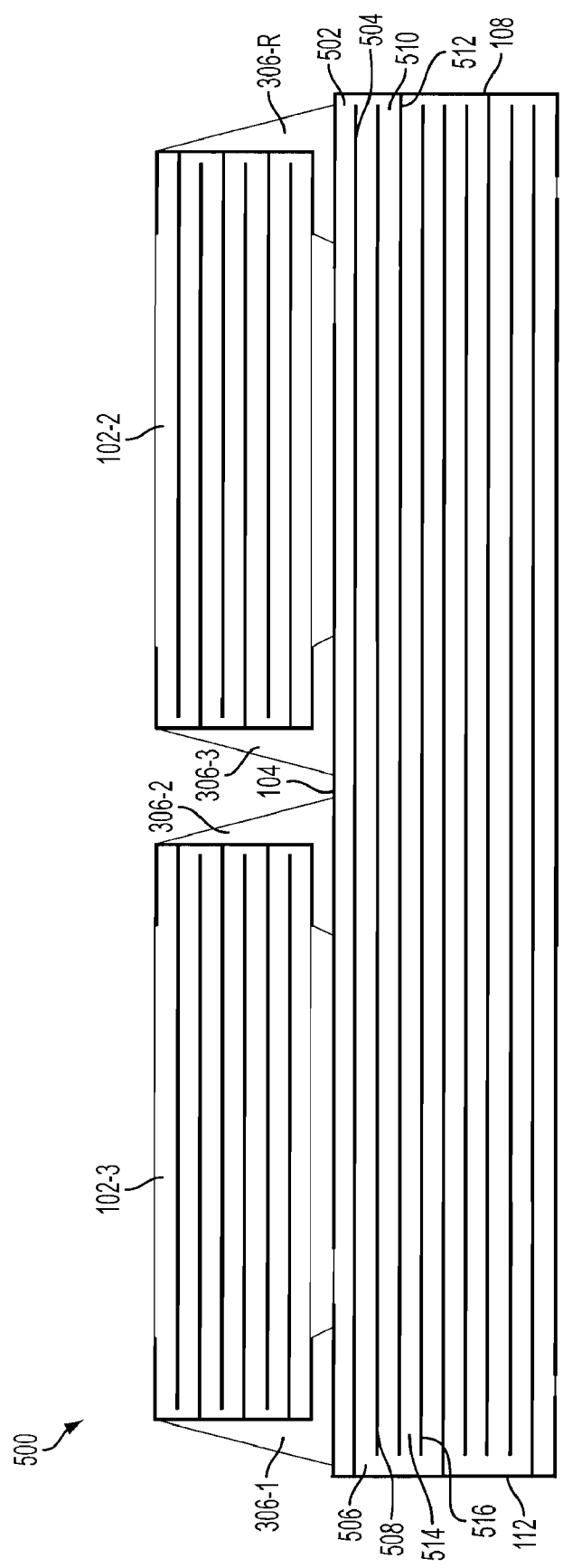
FIG. 5 is a cross section view of one embodiment of the package cap assembly of FIG. 1 along line A-A.

FIG. 5 is a cross section view of one embodiment of package cap 100 of FIG. 1, with chip capacitors 102-1 through 102-N attached, along line A-A shown generally as assembly 500. In this embodiment, the package cap 100 of FIG. 1 has integral bypass capacitance built into it by having multiple internal interleaved (alternating) power and ground conductor layers (plates) separated by thin insulating layers with a high relative dielectric constant (Er) for maximum capacitance. In one embodiment, package cap 100 of FIG. 1 contains only internal bypass capacitance (no chip capacitors attached). In another embodiment, package cap 100 of FIG. 1 contains both external (chip capacitors) and internal bypass capacitance. In one embodiment, the external capacitance is accomplished through the use of one or more multilayer surface mount ceramic capacitors.

In this embodiment, there is a plurality of common ground and two separate power conductor layers that receive power from different sources. These layers are hereinafter referred to as "common ground plate", "power one plate" and "power two plate" and examples of them are described below with respect to common ground plate 602, power one plate 702 and power two plate 802 in FIGS. 6, 7 and 8 respectively. The top surface layer of the internal bypass capacitance is comprised of the capacitor attach pad portions of power terminals 106, 108, 110 and 112 (power terminals 106, and 110 not visible) and the capacitor attach pad portions of ground terminal 104. Abutting the top surface layer is a first insulating layer 502 that separates the top surface capacitor attach pads from a first power two plate 504. Abutting first power two plate 504 is a second insulating layer 506 that separates first power two plate 504 from a first common ground plate 508. Abutting the first common ground plate 508 is a third insulating layer 510 that separates first common ground plate 508 from a first power one plate 512. First power one plate 512 abuts a fourth insulating layer 514 that separates first power one plate 512 from a second common ground plate 516. The layers are repeated in the order specified above.

In one embodiment, the first layer after the first insulating layer 502 is the first common ground plate 508. In another embodiment, the first layer after the first insulating layer 502 is the first power one plate 512. In one embodiment, the alternating layers provide a radiation shield for the integrated circuit.

In one embodiment, first power one plate 512 and all subsequent power one plates are vertically connected via first power terminals 106 and 108. Likewise, first power two plate 504 and all subsequent power two plates are vertically connected via second power terminals 110 and 112. The vertical connections reduce the path length between the power plates 504 and 512 and the integrated circuit when it is electrically connected. The combination of terminating each power plate on both ends and short wide vertical edge connections between plates reduces the ESL and ESR between the IC and its bypass capacitance.

In one embodiment, first common ground plate 508 and all subsequent ground conducting layers are vertically connected via ground terminal 104 as the ground terminal 104 is wrapped around the adaptor substrate as shown in FIG. 1. In one embodiment, the common ground plates are as described with respect to common ground plate 602 in FIG. 6 below and are electrically connected to the ground terminal 104 through the use of edge metallizations on each common ground plate. The combination of terminating each common ground plate on both ends and short wide vertical connections between plates reduces the ESL and ESR between the integrated circuit and its bypass capacitance.

Figure 6:
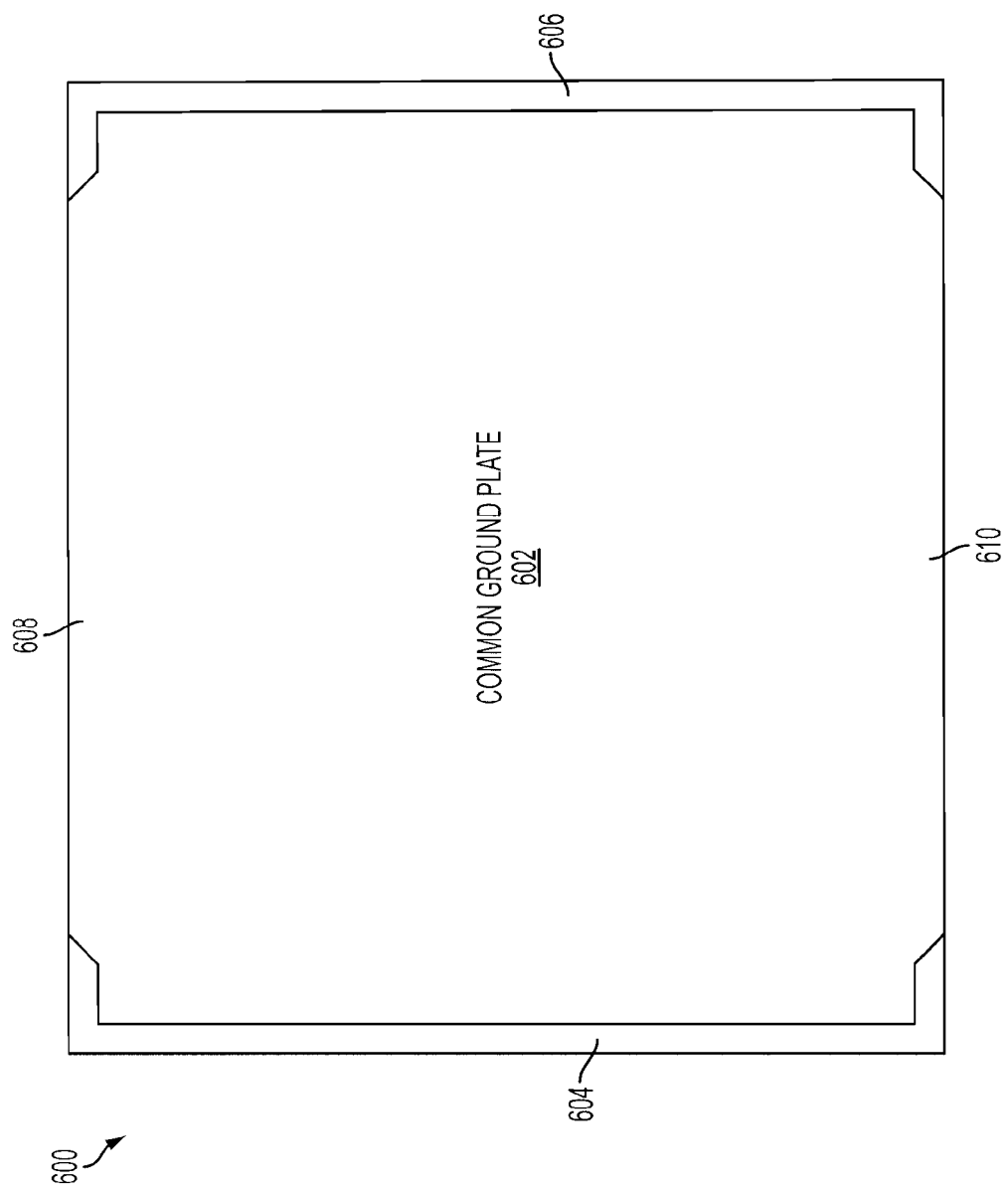
FIG. 6 is a cross section view of one embodiment of the package cap assembly of FIG. 3 along line B-B.

FIG. 6 is a cross section view of one embodiment of package cap 300 of FIG. 3 along line B-B shown generally at 600. In one embodiment, the package cap 300 of FIG. 3 has one or more internal bypass capacitance layers as described with respect to FIG. 5 above. The internal bypass capacitance comprises a common ground plate (layer) 602. Common ground plate 602 has edge gaps 604 and 606 which isolate common ground plate 602 and do not provide electrical connections to other components. Common ground plate 602 comprises edge extensions 608 and 610 which connect common ground plate 602 to the edge metalizations of ground terminal 104. The combination of terminating each common ground plate 602 on both ends and short wide vertical connections between plates reduces the ESL and ESR between the IC and its bypass capacitance.

Figure 7:
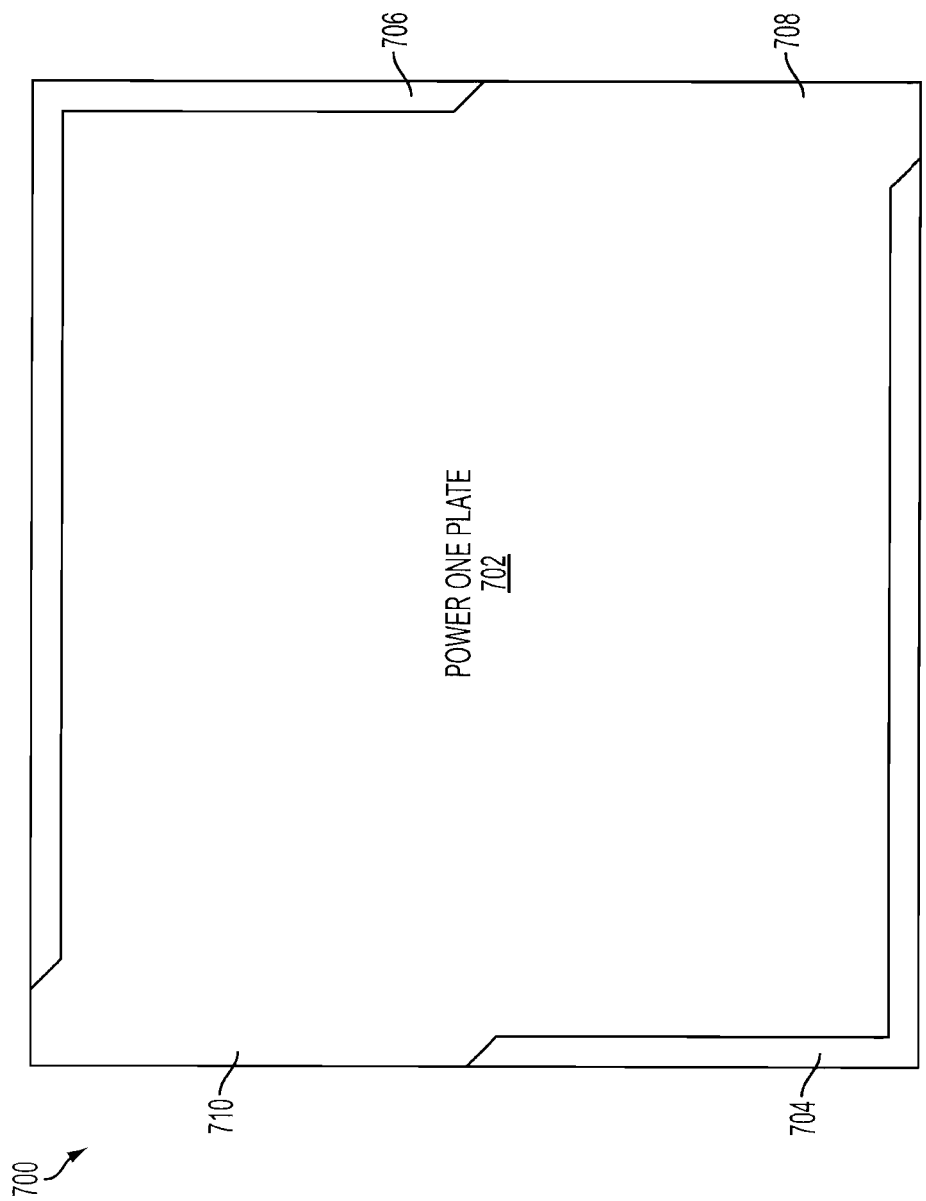
FIG. 7 is a cross section view of one embodiment of the package cap assembly of FIG. 3 along line B-B.

FIG. 7 is a cross section view of one embodiment of package cap 300 of FIG. 3 along line B-B shown generally at 700. In one embodiment, the package cap 300 of FIG. 3 has internal bypass capacitance as described with respect to FIG. 5. The internal bypass capacitance comprises a power one plate 702. Power one plate 702 has edge gaps 704 and 706 which isolate power one plate 702 and do not provide electrical connections to other components. Power one plate 702 also comprises edge extensions 708 and 710. Edge extensions 708 and 710 connect power one plate 702 to the edge metalizations of first power terminals 106 and 108 shown in FIG. 5 (power terminal 106 is not visible in FIG. 5).

Figure 8:
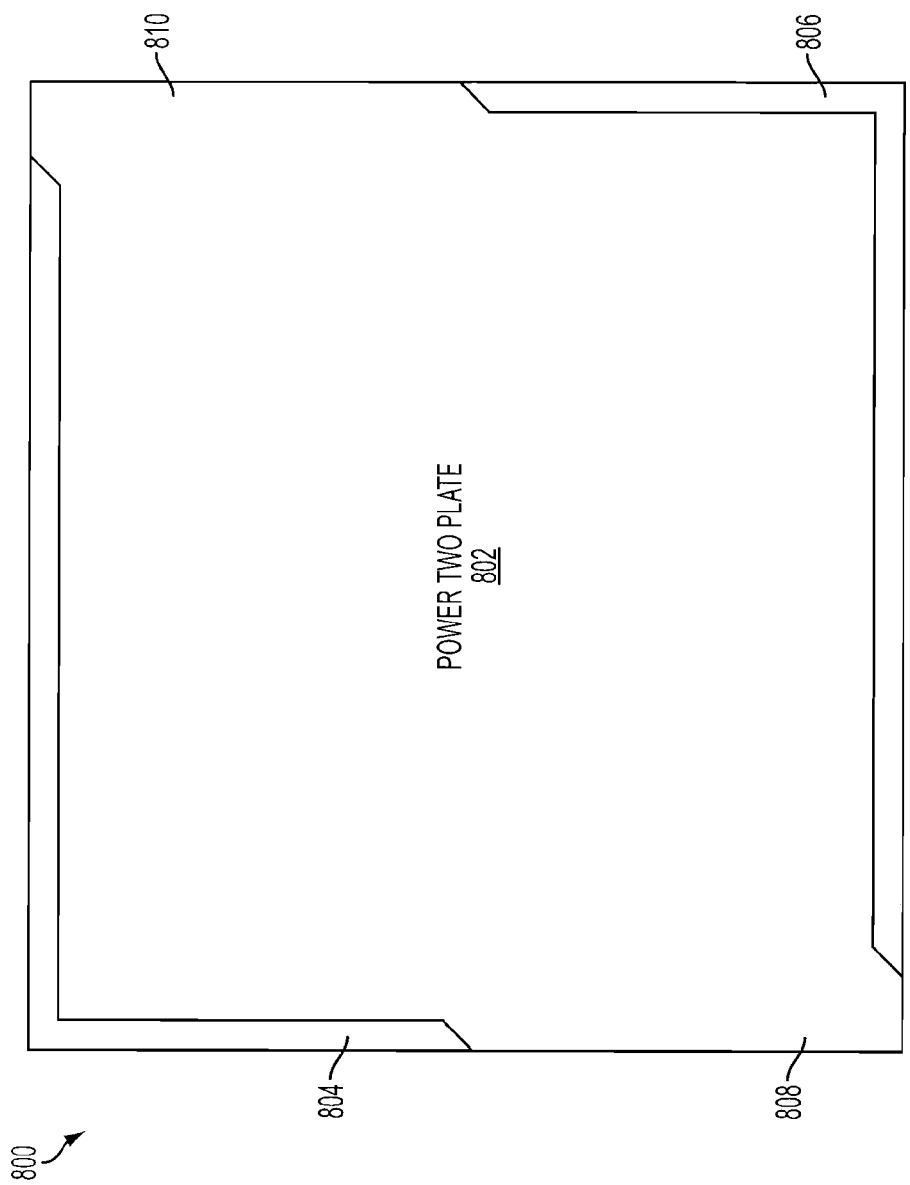
FIG. 8 is a cross section view of one embodiment of the package cap assembly of FIG. 3 along line B-B.

FIG. 8 is a cross section view of one embodiment of the package cap 300 of FIG. 3 along line B-B shown generally at 800. In one embodiment, the package cap 300 of FIG. 3 has internal bypass capacitance as described with respect to FIG. 5. The internal bypass capacitance comprises a power two plate 802. Power two plate 802 has edge gaps 804 and 806. Edge gaps 804 and 806 isolate power two plate 802 and do not provide electrical connections to other components. Power two plate 802 also comprises edge extensions 808 and 810. Edge extensions 808 and 810 connect power two plate 802 to the edge metalizations of second power terminals 110 and 112 shown in FIG. 5 (power terminal 110 is not visible in FIG. 5).

Figure 9:
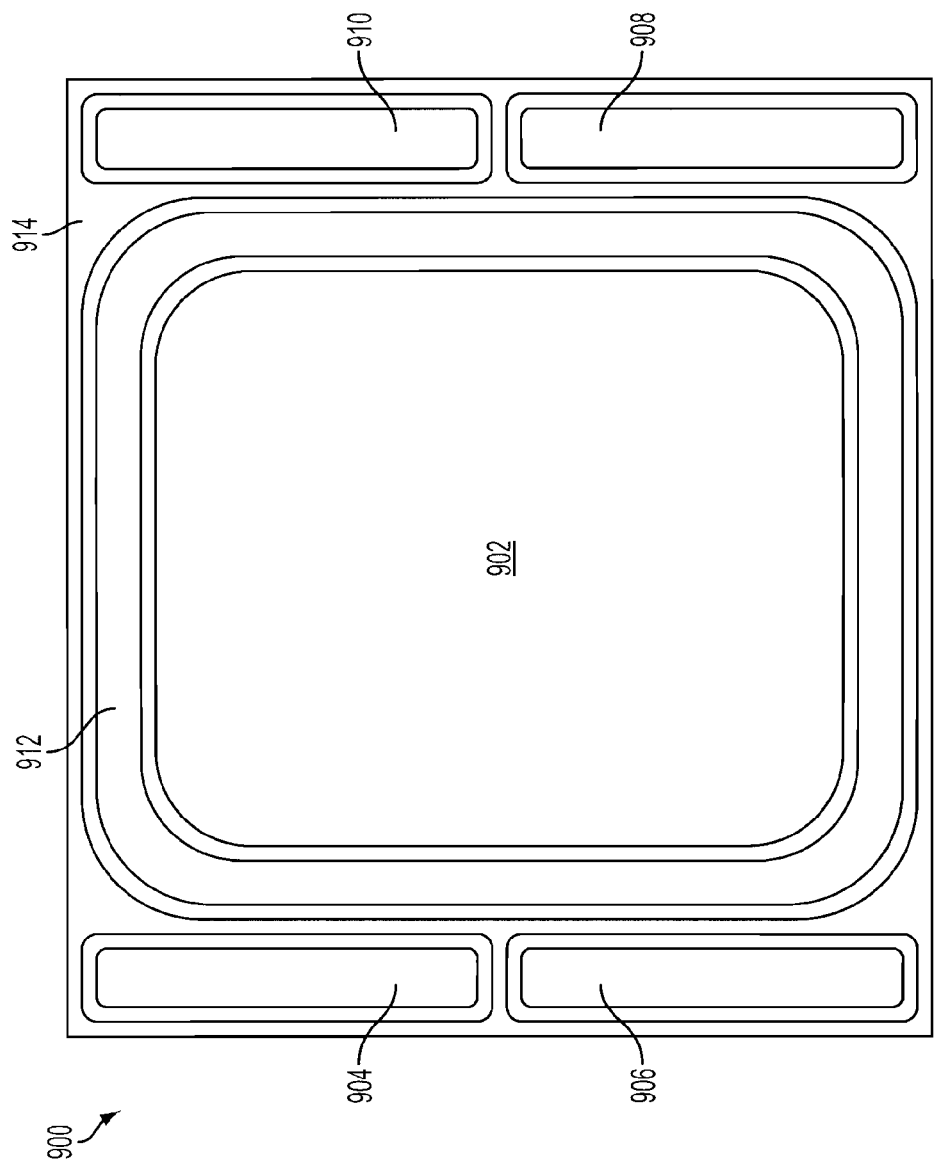
FIG. 9 is a top view of a base portion of a package of one embodiment of the present invention.

FIG. 9 is a top view of a base portion of a package shown generally at 900. Base portion 900 comprises protrusions 904, 906, 908, 910 and 912 that extend from a surface of body 914 of base portion 900. Protrusion 912 forms a cavity 902 that is adapted to receive an integrated circuit. In one embodiment, protrusions 904, 906, 908, 910 and 912 are made of Kovar and body 914 is made of ceramic. The rounded edges of protrusions 904, 906, 908, 910 and 912 inhibit braze or solder crack initiation.

Protrusion 904 is adapted to mate with power terminal 106 of FIG. 2 via a reflow process using solder. Protrusion 906 is adapted to mate with power terminal 112 of FIG. 2 via a reflow process using solder. Protrusion 908 is adapted to mate with power terminal 108 of FIG. 2 via a reflow process using solder. Protrusion 910 is adapted to mate with power terminal 110 of FIG. 2 via a reflow process using solder. Protrusion 912 is adapted to mate with seal ring 202 of FIG. 2 via a reflow process using solder. The spaces between protrusion 912 and protrusions 904, 906, 908 and 912 provide electrical isolation between them and facilitate post solder cleaning between them. When protrusion 912 is mated with seal ring 202, cavity 902 is substantially enclosed.

Figure 10:
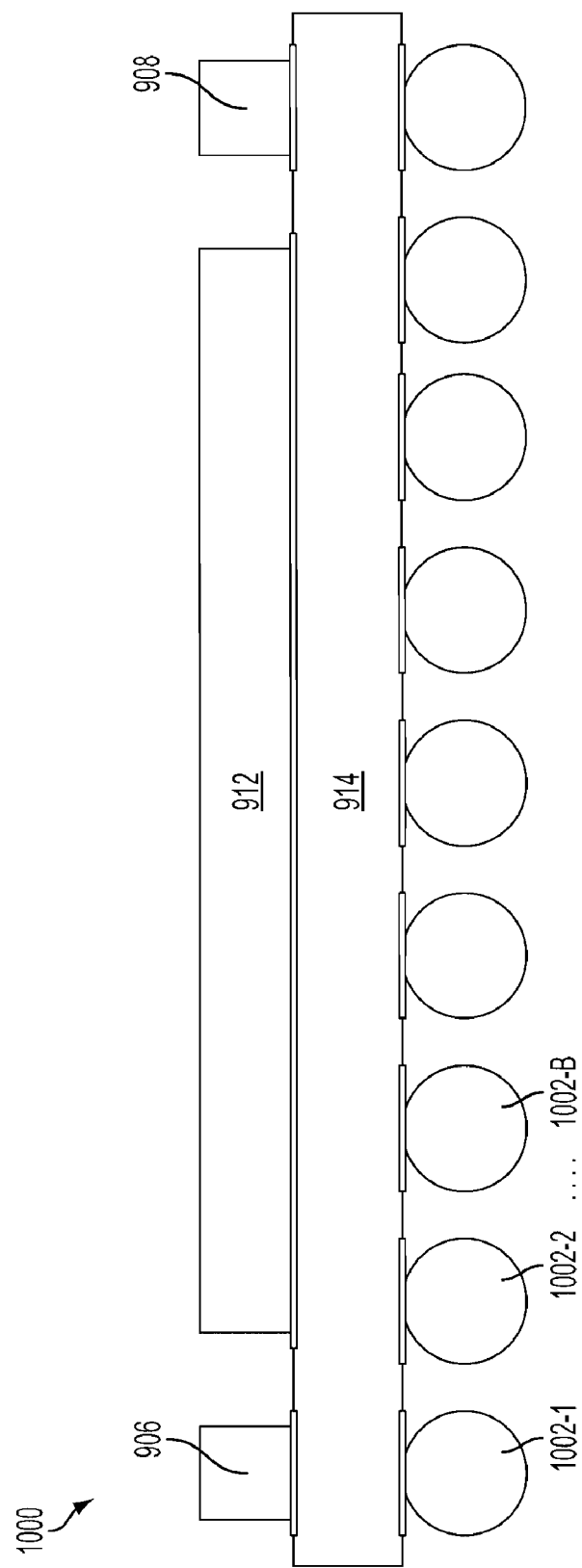
FIG. 10 is a front edge view of the base portion of the package of FIG. 9 of one embodiment of the present invention.

FIG. 10 is a front edge view of the base portion of the package of FIG. 9 shown generally at 1000. Base portion 1000 is comprised of protrusions 906, 908 and 912. Protrusions 906, 908 and 912 extend from a surface of body 914. In one embodiment, body 914 is a ceramic ball grid array (CBGA) and includes solder balls 1002-1 through 1002-B. The dark thin lines between body 914 and solder balls 1002-1 through 1002-B represent terminal connections. Likewise, the dark thin lines between body 914 and protrusions 906, 908 and 912 represent terminal connections. Other types of base portion 1000 include but are not limited to ceramic quad flat pack (CQFP) designs, ceramic dual flat pack (CDFP) designs, ceramic dual inline package (CDIP) designs, or any other suitable base designs.

Figure 11:
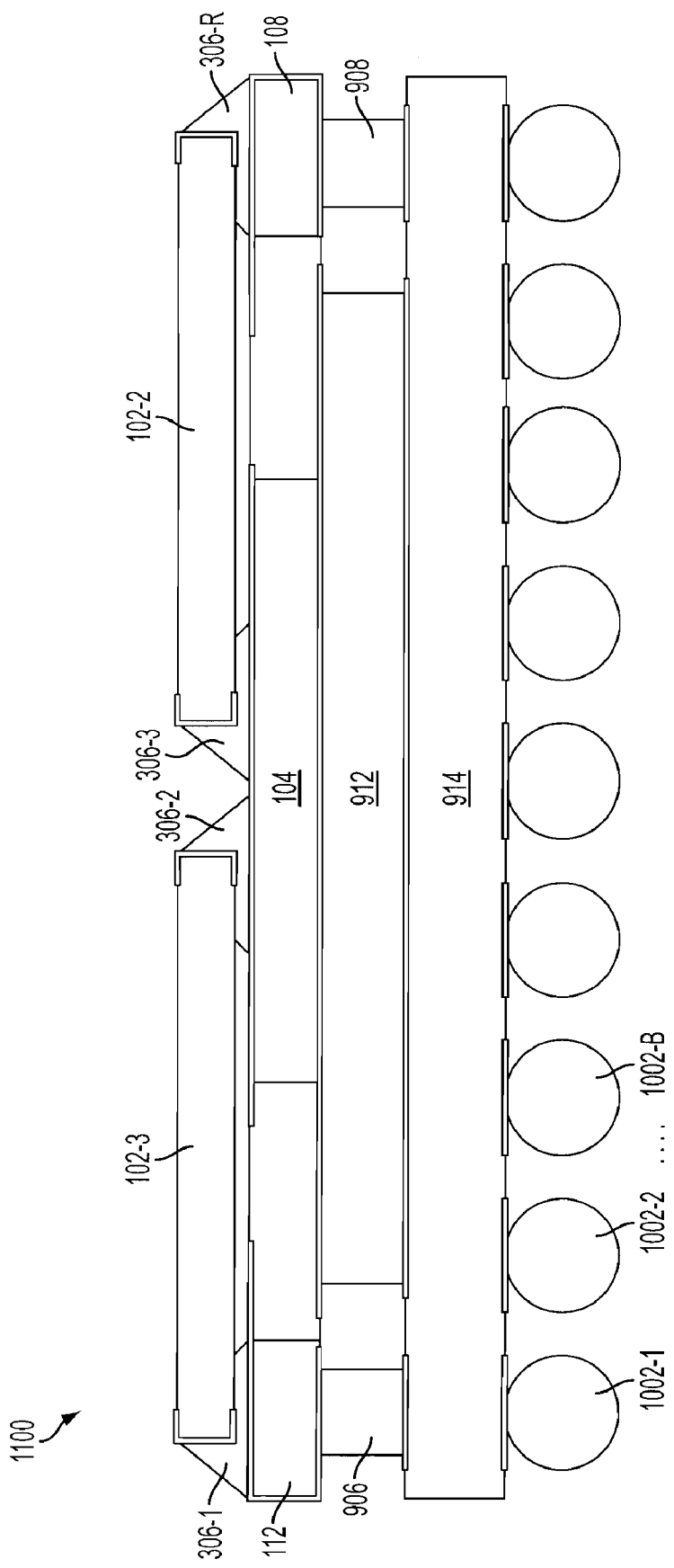
FIG. 11 is a front edge view of the base portion of FIG. 10 coupled to the package cap of FIG. 3 with attached chip capacitors of one embodiment of the present invention.

FIG. 11 is a front edge view of the base portion 1000 of FIG. 10 coupled to the package cap assembly 300 of FIG. 3 shown generally at 1100. In this embodiment, package cap assembly 300 is comprised of package cap 100 and attached chip capacitors 102-1 to 102-N (102-2 and 102-3 shown). Chip capacitor 102-3 is soldered onto a power terminal 112 on one end via solder connection 306-1. On the other end, chip capacitor 102-3 is soldered onto ground terminal 104 via solder connection 306-2. Chip capacitor 102-2 is soldered onto a power terminal 108 on one end via solder connection 306-R. On the other end, chip capacitor 102-2 is soldered onto ground terminal 104 via solder connection 306-3.

Ground terminal 104 wraps around as shown, and provides an electrical connection to the base 1000 and an integrated circuit disposed within the base 1000. Base portion 1000 is comprised of protrusions 904, 906, 908, 910 and 912 (904 and 910 not visible). A seal ring 202 of FIG. 2 substantially covers a cavity formed by protrusion 912. Seal ring 202 is soldered onto protrusion 912 via a reflow process. Protrusions 906, 908 and 912 extend from a surface of body 914. In one embodiment, body 914 is a ceramic ball grid array (CBGA) and includes solder balls 1002-1 through 1002-B.

Figure 12:
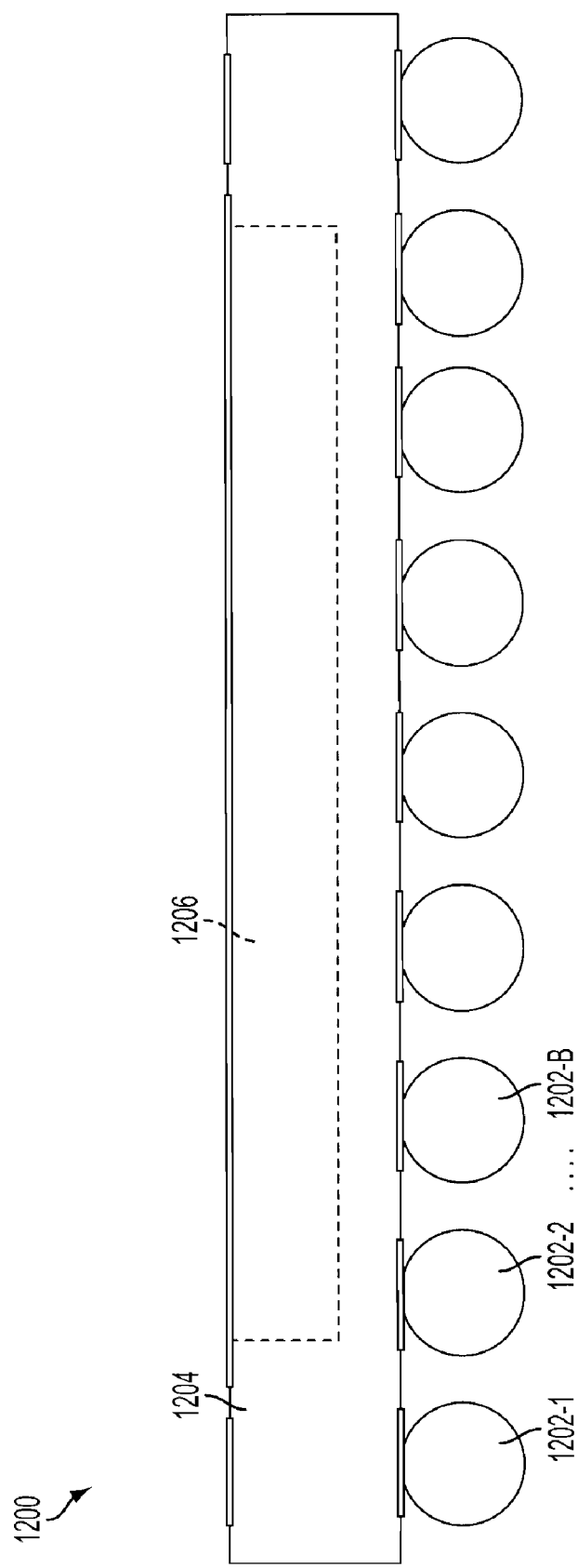
FIG. 12 is a front edge view of a base portion of a package of one embodiment of the present invention.

FIG. 12 is a view of a base portion 1200 of one embodiment of the present invention. Base portion 1200 is comprised of a body 1204 that forms a cavity 1206. Cavity 1206 is adapted to receive an integrated circuit. In one embodiment, body 1204 is a ceramic ball grid array (CBGA) and includes solder balls 1202-1 through 1202-B.

Figure 13:
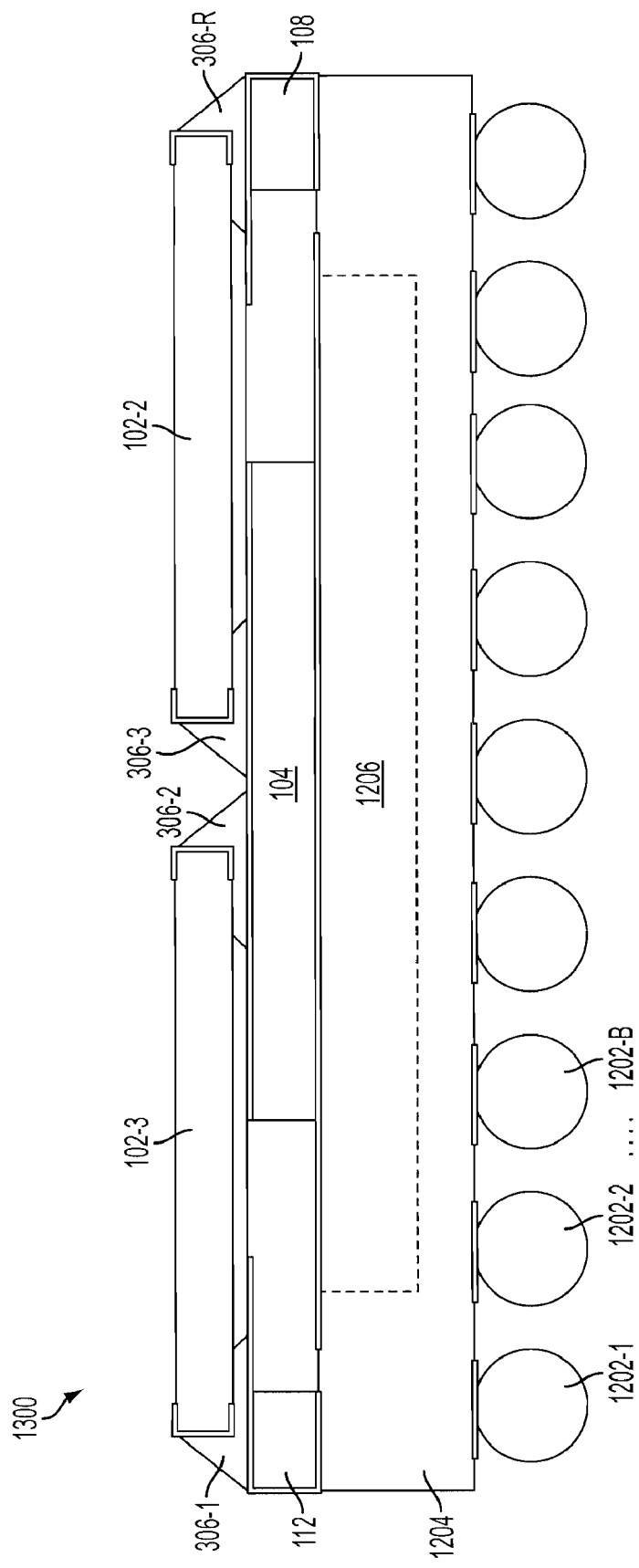
FIG. 13 is a front edge view of the package base portion of FIG. 12 mated to the package cap of FIG. 3 with attached chip capacitors of one embodiment of the present invention.

FIG. 13 is a view of the base portion 1200 of FIG. 12 mated to the package cap assembly 300 of FIG. 3 forming a package shown generally at 1300. In this embodiment, package cap assembly 300 is comprised of package cap 100 and attached chip capacitors 102-1 to 102-N (102-2 and 102-3 shown). Chip capacitor 102-3 is soldered onto a power terminal 112 on one end via solder connection 306-1. On the other end, chip capacitor 102-3 is soldered onto ground terminal 104 via solder connection 306-2. Chip capacitor 102-2 is soldered onto a power terminal 108 on one end via solder connection 306-R. On the other end, chip capacitor 102-2 is soldered onto ground terminal 104 via solder connection 306-3.

The seal ring 202 of FIG. 2 substantially covers a cavity 1206 formed by a body 1204. The package attach pad portions of ground terminal 104 (seal ring 202) and power terminals 106, 108, 110 and 112 of package cap assembly 300 are soldered to mating attach pads of body 1204 via a reflow process. In one embodiment, package cap assembly 300 is a ceramic X7R package cap and base 1200 is a ceramic ball grid array (CBGA) and includes solder balls 1202-1 through 1202-B. Examples of other types of ceramic package caps include but are not limited to X5R, Y5V and Z5U package caps. In one embodiment, when package cap assembly 300 and base 1200 are soldered together the seal formed is hermetic and applicable to military and space applications.

Figure 14:
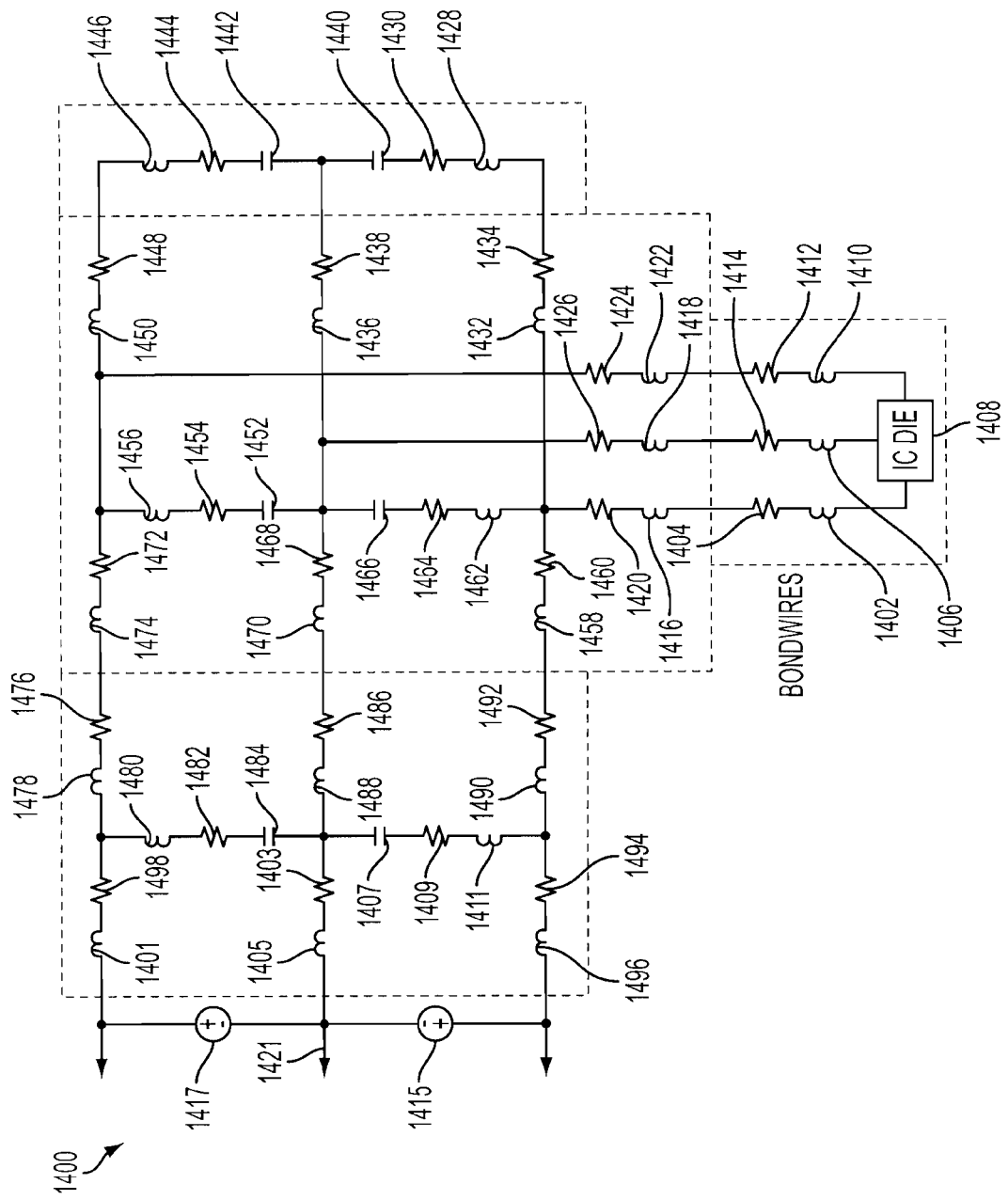
FIG. 14 is a circuit diagram of one embodiment of providing bypass capacitance to an integrated circuit of the present invention.

FIG. 14 is a circuit diagram of one embodiment of providing bypass capacitance to an integrated circuit shown generally at 1400. The circuit diagram 1400 represents the series inductance and resistance in the power and ground paths between a packaged IC, the packaged IC's bypass capacitance and the power sources to the package IC's host printed wiring board (PWB). The circuit diagram 1400 is comprised of a packaged IC die 1408. IC die 1408 is connected to a first power terminal 1413 and a second power terminal 1419. First power terminal 1413 is comprised of a voltage supplied by a first voltage source 1415. Second power terminal 1419 is comprised of a voltage supplied by a second voltage source 1417. First voltage source 1415 and second voltage source 1417 have a common ground 1421.

In this embodiment, a first inductor 1402 and a first resistor 1404, a second inductor 1406 and a second resistor 1414, and a third inductor 1410 and a third resistor 1412 model the parallel equivalent series inductance and resistance of all first power, common ground and second power connection paths across the bondwire interface between the IC die 1408 and the package, respectively.

A fourth inductor 1416 and a fourth resistor 1420 and a fifth inductor 1418 and a fifth resistor 1426 and a sixth inductor 1422 and a sixth resistor 1424 model the parallel equivalent series inductance and resistance of all first power, common ground, and second power connection paths between the package wire bond pads and the package first power, common ground and second power planes, respectively.

A seventh inductor 1432 and a seventh resistor 1434 and an eighth inductor 1436 and an eighth resistor 1438 and a ninth inductor 1450 and a ninth resistor 1448 model the parallel equivalent series inductance and resistance of all connection paths between the package first power, common ground and second power planes and the on-package chip capacitor attach pads or a package cap attachment interface, respectively.

A tenth inductor 1458 and a tenth resistor 1460 and an eleventh inductor 1470 and an eleventh resistor 1468 and a twelfth inductor 1474 and a twelfth resistor 1472 model the parallel equivalent of all connection paths between the package first power, common ground and second power planes and the package PWB attach pads, respectively.

A thirteenth inductor 1490 and a thirteenth resistor 1492 and a fourteenth inductor 1488 and a fourteenth resistor 1486 and a fifteenth inductor 1478 and a fifteenth resistor 1476 model the parallel equivalent series inductance and resistance of all connection paths between the package PWB attach pads and the first power, common ground and second power PWB planes, respectively.

A sixteenth inductor 1496 and a sixteenth resistor 1494 and a seventeenth inductor 1405 and a seventeenth resistor 1403 and an eighteenth inductor 1401 and an eighteenth resistor 1498 model the parallel equivalent series inductance and resistance of all connection paths between the first power, common ground and second power PWB planes and power sources 1415 and 1417, respectively.

A first capacitor 1440 and a second capacitor 1442 model the parallel equivalent first power and second power capacitance of all on-package chip capacitors or a package cap integral and attached capacitance, respectively. A nineteenth inductor 1428 and a nineteenth resistor 1430 and a twentieth inductor 1446 and a twentieth resistor 1444 model the parallel equivalent ESL and ESR of all first power and second power on-package chip capacitors or package cap integral and attached capacitance, respectively.

A third capacitor 1466 and a fourth capacitor 1452 model the parallel equivalent of all first power terminal 1413 and second power terminal 1419 package plane-plane capacitance (usually small), respectively. A twenty-first inductor 1462 and a twenty-first resistor 1464 and a twenty-second inductor 1456 and a twenty-second resistor 1454 model the ESL and ESR of the first power and second power package plane-plane capacitance, respectively.

A fifth capacitor 1407 and a sixth capacitor 1484 model the parallel equivalent of all first power and second power bypass capacitors on the PWB, respectively. A twenty-third inductor 1411 and a twenty-third resistor 1409 and a twenty-forth inductor 1480 and a twenty-forth resistor 1482 model the ESL and ESR of all first power and second power bypass capacitors on the PWB, respectively. If there is no room for on-package chip capacitors or a package cap, modeled by first capacitor 1440 and second capacitor 1442, the IC die 1408 must rely entirely on the bypass capacitance provided by third capacitor 1466, fourth capacitor 1452, fifth capacitor 1407 and sixth capacitor 1484, which are typically too small or too far away with too much series inductance and resistance to be effective.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. An integrated circuit package, the package comprising:
    a package base, wherein the base comprises a cavity adapted to receive an integrated circuit; and
    a lid, adapted to cover an integrated circuit, wherein the lid is further adapted to couple to the package base and substantially cover the cavity, and wherein the lid is further adapted to provide bypass capacitance to the integrated circuit; and wherein the lid further comprises:
        a ground seal ring attach pad that is soldered to the package base and provides an electrical connection to the package base and internal integrated circuits, wherein the around seal ring attach pad provides a hermetic seal between the lid and the package base.

2. The package of claim 1, wherein the lid further comprises:
    one or more capacitors to provide the bypass capacitance.

3. The package of claim 2, wherein the one or more capacitors are integrated into the lid.

4. The package of claim 3, wherein the one or more capacitors further comprises:
    alternating ground conductor layers, power conductor layers, and insulating layers.

5. The package of claim 4, wherein the power conductor layers are edge terminated to reduce equivalent series inductance and equivalent series resistance.

6. The package of claim 4, wherein the ground conductor layers are edge terminated to reduce equivalent series inductance and equivalent series resistance.

7. The package of claim 4, wherein the lid further comprises:
    a ground terminal, wherein the ground terminal provides an electrical connection to the lid and package base and the ground conductor layers.

8. The package of claim 2, wherein the one or more capacitors are attached to the lid.

9. The package of claim 8, wherein the lid further comprises:
    a ground terminal that is adapted to receive the one or more capacitors and provides an electrical connection to the package base and at least one internal integrated circuit.

10. The package of claim 8, wherein the lid further comprises:
    at least one power terminal that is adapted to receive the one or more capacitors and provides an electrical connection to the package base and its internal IC(s).

11. The package of claim 2, wherein the capacitance is integrated into the lid and one or more capacitors are attached to the lid.

12. The package of claim 11, wherein the capacitance integrated into the lid further comprises alternating ground conductor layers, power conductor layers, and insulating layers.

13. The package of claim 12, wherein the lid further comprises:
    a ground terminal that is adapted to receive the one or more capacitors attached to the lid and provides an electrical connection to the ground conductor layers integrated in the lid.

14. The package of claim 13, wherein the lid further comprises:
    at least one power terminal that is adapted to receive the one or more capacitors attached to the lid and provides an electrical connection to the power conductor layers integrated in the lid.

15. The package of claim 1, wherein the lid further comprises:
    at least one power terminal that provides an electrical connection to the package base and at least one internal integrated circuit.

16. The package of claim 15, wherein the at least one power terminal provides an electrical connection to one or more power conductor layers.

17. The package of claim 1, wherein the package base is at least one of a ceramic ball grid array, a ceramic quad flat pack, a ceramic dual flat pack, and a ceramic dual inline package.

18. An integrated circuit bypass capacitance system, the system comprising:
    an integrated circuit; and
    a package, the package including,
        a package base, wherein the base comprises a cavity adapted to receive one or more integrated circuits, and
        a lid adapted to couple to the package base and substantially cover the integrated circuit, wherein the lid is further adapted to provide bypass capacitance to the integrated circuit, and wherein the lid further comprises:
            a ground seal ring attach pad that is soldered to the package base and provides an electrical connection to the package base and internal integrated circuits, wherein the ground seal ring attach pad provides a hermetic seal between the lid and the package base.

19. The system of claim 18, wherein the lid further comprises:
    one or more capacitors to provide the bypass capacitance.

20. The system of claim 19, wherein the bypass capacitance is integrated into the lid.

21. The system of claim 20, wherein the integrated circuit bypass capacitance system further comprises alternating ground conductor layers, power conductor layers, and insulating layers.

22. The system of claim 19, wherein one or more capacitors are attached to the lid.

23. The system of claim 19, wherein the bypass capacitance is integrated into the lid and one or more capacitors are attached to the lid.

24. The system of claim 23, wherein the bypass the capacitance integrated into the lid further comprises alternating ground conductor layers, power conductor layers, and insulating layers.

25. The system of claim 24, wherein the lid further comprises:
- a ground terminal that is adapted to receive the one or more capacitors attached to the lid and provides an electrical connection to the ground conductor layers integrated in the lid.

26. The system of claim 24, wherein the lid further comprises:
- at least one power terminal that is adapted to receive the one or more capacitors attached to the lid and provides an electrical connection to the power conductor layers integrated in the lid.

27. A base adapted to couple to a bypass capacitance lid, the base comprising:
- a body; and
- a cavity formed inside the body to receive an integrated circuit; and
- mating attach pads selectively positioned along the body adapted to couple the bypass capacitance lid to the body and provide electrical connections to the integrated circuit, wherein the electrical connections provide a circuit connection to the bypass capacitance lid, and wherein a seal formed by coupling the bypass capacitance lid to the body is hermetic.

* * * * *